United States Patent
Song et al.

(10) Patent No.: US 7,371,502 B2
(45) Date of Patent: May 13, 2008

(54) METHODS OF FABRICATING ORGANIC LIGHT EMITTING DISPLAY AND DONOR SUBSTRATE

(75) Inventors: Myung-Won Song, Suwon-si (KR); Seong-Taek Lee, Suwon-si (KR); Mu-Hyun Kim, Suwon-si (KR); Byung-Doo Chin, Seongnam-si (KR); Tae-Min Kang, Suwon-si (KR); Jae-Ho Lee, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 43 days.

(21) Appl. No.: 11/017,679

(22) Filed: Dec. 22, 2004

(65) Prior Publication Data

US 2006/0046182 A1    Mar. 2, 2006

(30) Foreign Application Priority Data

Aug. 30, 2004    (KR) .............. 10-2004-0068772

(51) Int. Cl.
*G03F 7/00*    (2006.01)
(52) U.S. Cl. .............. 430/199; 430/200; 430/203; 430/207; 428/690
(58) Field of Classification Search .............. 430/199, 430/200, 203, 207; 428/690
See application file for complete search history.

(56) References Cited

U.S. PATENT DOCUMENTS 6,291,116 B1 *  9/2001  Wolk et al. .............. 430/14
6,562,146 B1 *  5/2003  DeYoung et al. .............. 134/30
6,566,032 B1 *  5/2003  Boroson et al. .............. 430/200
6,582,875 B1 *  6/2003  Kay et al. .............. 430/200
6,602,790 B2 *  8/2003  Kian et al. .............. 438/690
6,610,455 B1 *  8/2003  Burberry et al. .............. 430/200
6,682,863 B2 *  1/2004  Rivers et al. .............. 430/22
6,695,030 B1 *  2/2004  Phillips et al. .............. 156/540
6,703,180 B1 *  3/2004  Boroson et al. .............. 430/200
6,811,938 B2 * 11/2004  Tutt et al. .............. 430/22
6,890,627 B2 *  5/2005  Culver et al. .............. 428/195.1
6,928,746 B2 *  8/2005  Arena-Foster et al. .............. 34/351
6,949,145 B2 *  9/2005  Banerjee et al. .............. 134/1
7,056,391 B2 *  6/2006  Banerjee et al. .............. 134/26

FOREIGN PATENT DOCUMENTS

| JP | 2003-031362 | 1/2003 |
| JP | 2003-068455 | 3/2003 |
| JP | 2003-077658 | 3/2003 |
| JP | 2003-243163 | 8/2003 |

(Continued)

*Primary Examiner*—Amanda Walke
(74) *Attorney, Agent, or Firm*—H. C. Park & Associates, PLC

(57) ABSTRACT

Methods of fabricating an OLED and a donor substrate are provided. The method includes: preparing a base substrate of a donor substrate; forming a light to heat conversion layer and a transfer layer on the base substrate; preparing a donor substrate including performing a dry cleaning process after forming the transfer layer; preparing a substrate, on which the transfer layer of the donor substrate is to be transferred; laminating the donor substrate and the substrate; and patterning the transfer layer by irradiating a laser to transfer the transfer layer on the substrate.

19 Claims, 2 Drawing Sheets

FOREIGN PATENT DOCUMENTS

| | | |
|---|---|---|
| JP | 2003-332062 | 11/2003 |
| JP | 2004-079540 | 3/2004 |
| KR | 2002-0064302 | 8/2002 |
| KR | 1020040054474 | 6/2004 |
| KR | 10-0445607 | 8/2004 |

* cited by examiner

METHODS OF FABRICATING ORGANIC LIGHT EMITTING DISPLAY AND DONOR SUBSTRATE

CROSS-REFERENCE TO RELATED APPLICATION

This application claims the benefit of Korean Patent Application No. 2004-68772, filed Aug. 30, 2004, the disclosure of which is hereby incorporated herein by reference in its entirety.

BACKGROUND OF THE INVENTION

1. Field of the Invention

The present invention relates to methods of fabricating an organic light emitting display and a donor substrate and, more particularly, to a method of fabricating an organic light emitting display using a donor substrate having a transfer layer which is cleaned by a dry cleaning process, and a method of fabricating the donor substrate.

2. Description of the Related Art

Since an organic light emitting display (OLED) among flat panel displays has the characteristics of a fast response speed of not more than 1 ms, low power consumption, and a wide viewing angle due to an emissive display, the OLED has advantages as a medium for displaying a moving picture regardless of device size. In addition, since the OLED may be fabricated in a low temperature and may be readily fabricated on the basis of conventional semiconductor manufacturing processes, the OLED is attracting public attention as a next generation flat panel display.

The OLED is generally classified into a polymer device using a wet process and a small molecular device using a deposition process depending on materials and processes for fabricating an organic light emitting diode.

In the case of an inkjet printing method among methods of patterning the polymer and small molecular emission layers, organic layers except for the emission layer should be made of restricted materials, and there is a troublesome process of forming a structure for inkjet printing on a substrate.

In addition, when the emission layer is patterned using a deposition process, it may be difficult to manufacture a large-sized display due to use of a metal mask.

In order to substitute for the patterning method, a laser-induced thermal imaging (LITI) method has been recently developed.

The LITI method is a method of converting a laser emitting from a light source to heat energy, and transferring a pattern forming material to a corresponding substrate using the heat energy to form a pattern. In order to performing the LITI method, a donor substrate, at which a transfer layer is formed, a light source, and a substrate as a subject are required.

In performing the LITI method, the donor substrate has a shape of covering the entire substrate as a receptor, and the donor substrate and the substrate are fixed on a stage.

After completion of the donor substrate for a laser induced thermal imaging process, contaminants generated from the exterior environment or during the process exist on the transfer layer. The contaminants may remain on the emission layer and the pixel electrode to generate failures of the display device such as spots or pixel defects in an emission region, thereby deteriorating the characteristics of the display device.

SUMMARY OF THE INVENTION

The present invention, therefore, solves aforementioned problems associated with conventional devices by providing methods of fabricating an OLED and a donor substrate capable of preventing defects of the OLED from generating due to contaminants during an LITI process by performing a dry cleaning process to remove the contaminants existing on a transfer layer of the donor substrate.

In an exemplary embodiment of the present invention, a method of fabricating an OLED includes preparing a base substrate of a donor substrate; forming a light to heat conversion(LTHC) layer and a transfer layer on the base substrate; preparing a donor substrate including performing a dry cleaning process after forming the transfer layer; preparing a substrate, on which the transfer layer of the donor substrate is to be transferred; laminating the donor substrate and the substrate; and patterning the transfer layer by irradiating a laser to transfer the transfer layer on the substrate.

In another exemplary embodiment according to the present invention, a method of fabricating a donor substrate includes preparing a base substrate; forming a light to heat conversion layer and a transfer layer on the base substrate; and performing a dry cleaning process after forming the transfer layer.

The dry cleaning process may be performed by a CO2 method, an ultrasonic method, or a laser pulse method.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Figure 1:
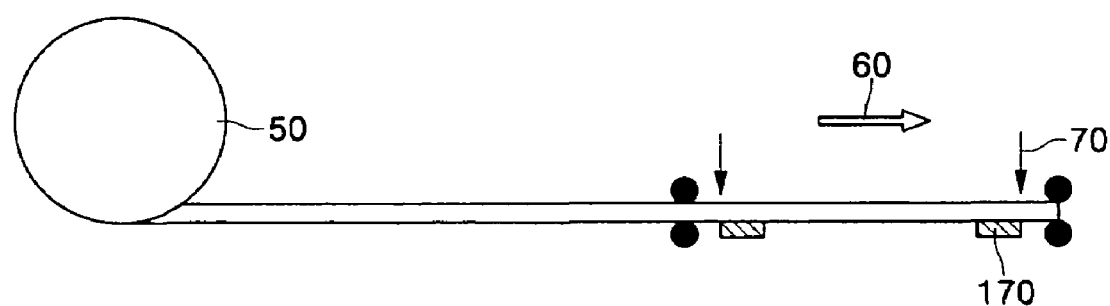
FIG. 1 is a cross-sectional view illustrating a base substrate framing process of a donor substrate for a laser induced thermal imaging process.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIG. 1 is a cross-sectional view illustrating a base substrate framing process of a donor substrate for a laser induced thermal imaging process.

Referring to FIG. 1, a roll type base substrate 50 is loaded on a framing apparatus. The base substrate 50 is cut after a frame 170 is attached under the base substrate 50, thereby completing the framed base substrate 110.

Figure 2:
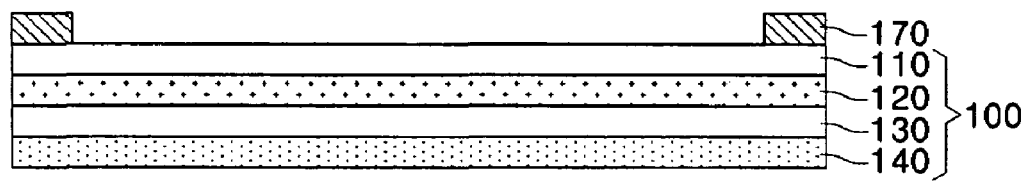
FIG. 2 is a cross-sectional view illustrating the process of forming a transfer layer on a framed base substrate.

FIG. 2 is a cross-sectional view illustrating the process of forming a transfer layer on the framed base substrate.

Referring to FIG. 2, a light to heat conversion layer 120 is formed on the framed base substrate 110, i.e., the base substrate 110 located on the frame 170, and a transfer layer 140 is formed on the light to heat conversion layer 120, thereby completing a donor substrate 100.

The donor substrate 100 may be made of the base substrate 110 of the roll state.

In addition, the base substrate 110 may use a flexible film or a solid substrate such as metal or glass.

Specifically describing, the light to heat conversion layer 120 is formed on the base substrate 110.

The light to heat conversion layer 120 is formed of a light absorbing material having characteristics absorbing light of infrared to visible region. The light to heat conversion layer 120 is one layer among an organic layer, in which a laser absorbing material is contained, a metal layer, and a composite layer of the metal layer and the organic layer. The light to heat conversion layer 120 functions to convert the laser irradiated from a laser irradiator to heat energy, and the heat energy changes an adhesive force between the transfer layer 140 and the light to heat conversion layer 120 to transfer the transfer layer on the substrate which is a subject.

The transfer layer 140 is formed on the light to heat conversion layer 120.

A buffer layer 130 may be interposed between the light to heat conversion layer 120 and the transfer layer 140 in order to prevent the transfer layer from being damaged and effectively adjust an adhesive force between the transfer layer 140 and the donor film.

The transfer layer 140 may be an emission layer of the OLED.

In addition, the transfer layer 140 of the donor substrate may further include at least one layer selected from a group of consisting of a hole injection layer, a hole transport layer, a hole blocking layer and an electron injection layer.

Figure 3:
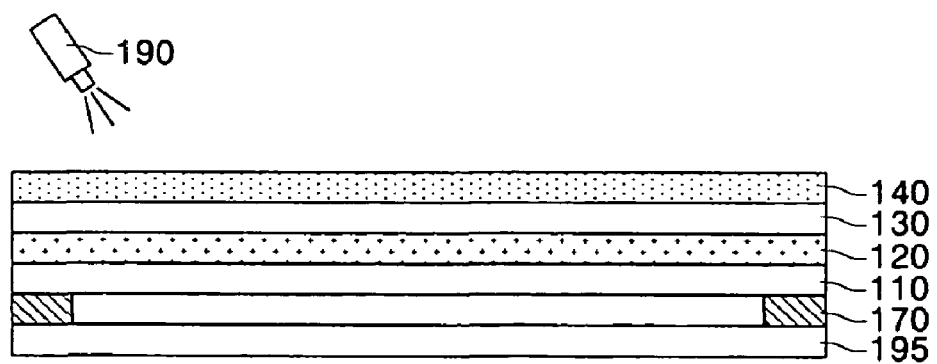
FIG. 3 is a cross-sectional view illustrating the process of dry cleaning the donor substrate, in which the transfer layer was formed.

FIG. 3 is a cross-sectional view illustrating the process of dry cleaning the donor substrate, in which the transfer layer was formed.

Referring to FIG. 3, a dry cleaning source 190 is located on the transfer layer 140 of the donor substrate 100.

Pressure applied from the dry cleaning source 190 to a surface of the transfer layer 140 may be not more than 0.7 Mpa, and the source 190 may be ejected from a point source or a linear source.

When the base substrate 110 is flexible, the dry cleaning process may be performed after fixing a donor substrate support 195 to a rear surface of the base substrate 110.

The dry cleaning process may be performed by a method using $CO_2$, an ultrasonic method, or a laser pulse method.

The $CO_2$ method removes contaminants by sublimating dry ice (solid $CO_2$) and simultaneously colliding the sublimated $CO_2$ on the substrate. That is, the $CO_2$ method means a cleaning mechanism using a physical force and a thermodynamic force of the dry ice expanded after the collision. Therefore, the $CO_2$ method is preferably performed in a humidity atmosphere of not more than 30% in order to prevent solid $CO_2$ from freezing.

The laser pulse method may remove particles existing on the surface of the substrate by irradiating a laser pulse on the surface of the transfer layer of the donor substrate, or by vibrating the air around the donor substrate to float the particles.

The laser pulse irradiating method of the laser pulse method removes the contaminants existing on the surface of the transfer layer by directly irradiating a laser beam on the surface of the transfer layer, and the air vibrating method of the laser pulse method floats foreign particles by vibrating the air spaced apart from the donor substrate using a strong laser pulse to remove the foreign particles. The floated particles may be removed by a blow or absorption method.

The ultrasonic method separates and absorbs particles by generating ultrasonic wave on the surface of the transfer layer of the donor substrate to remove the particles.

Therefore, the contaminants existing on the transfer layer by the external environment or during a manufacturing process after the completion of the donor substrate for a laser induced thermal imaging process may be removed through the dry cleaning process. As a result, it is possible to prevent the failures of the display device such as the spots and the pixel defects in the emission region due to the contaminants remaining on the emission layer and the pixel electrode during the LITI process, and to improve the characteristics of the display device.

In addition, after framing the base substrate, forming the light to heat conversion layer, and forming the buffer layer, the dry cleaning processes may be further performed, respectively.

Therefore, it may be possible to more effectively prevent the donor substrate from deteriorating and more stably perform the LITI process by removing the contaminants existing on each layer of the donor substrate 100.

Figure 4:
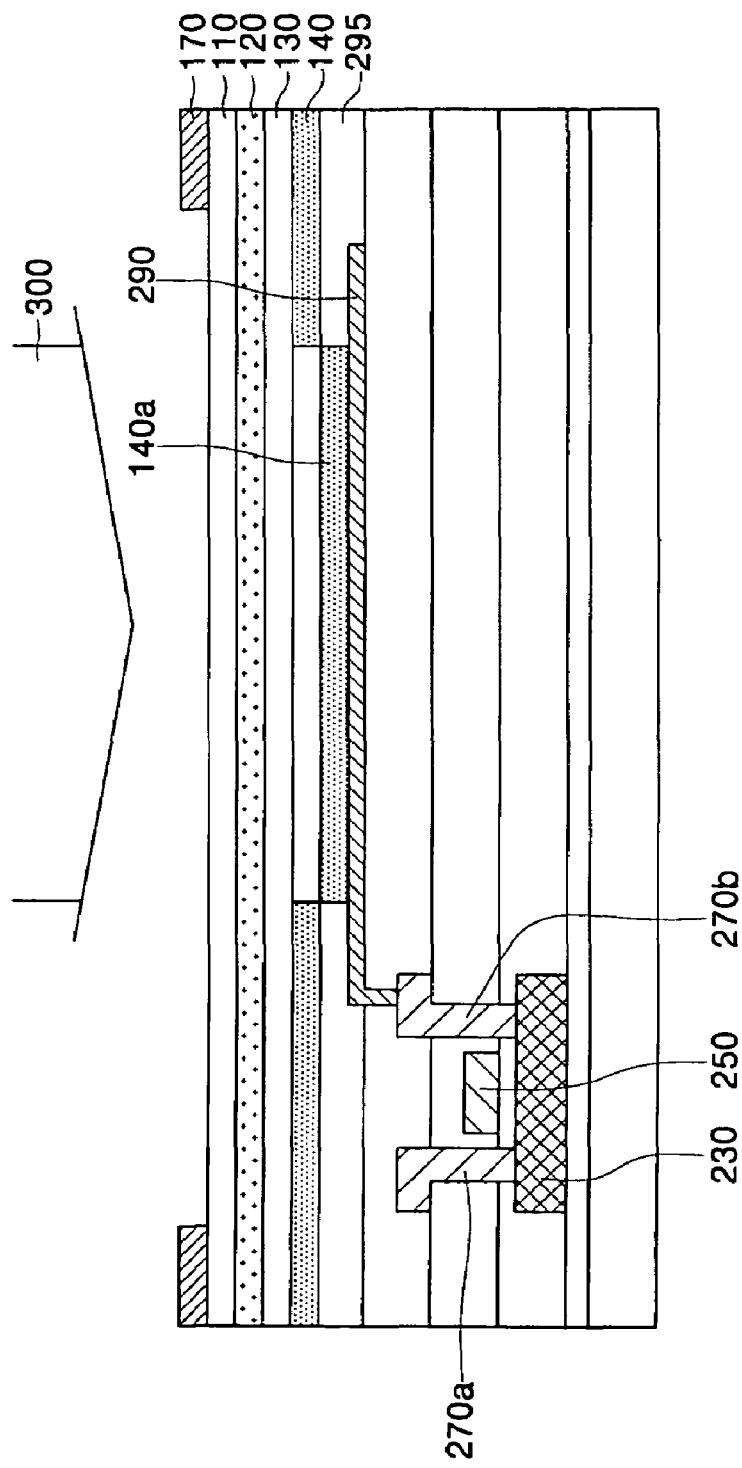
FIG. 4 is a cross-sectional view of a unit pixel formed by an LITI method.

FIG. 4 is a cross-sectional view of a unit pixel formed by an LITI method, which illustrates a method of fabricating an OLED using the cleaned donor substrate.

Referring to FIG. 4, a substrate for a display device, at which the transfer layer 140a of the donor substrate 100 is to be transferred, is prepared. The substrate has a TFT and a pixel electrode 290, and the donor substrate 100 which is subjected to the cleaning process is located on the substrate.

Specifically describing, a TFT including a semiconductor layer 230, a gate electrode 250, a source electrode 270a and a drain electrode 270b is formed on the substrate 210, and a pixel electrode 290 connected to the source electrode 270a or the drain electrode 270b of the TFT and exposed by a pixel defining layer 295 is formed.

After laminating the donor substrate 100 and the substrate 210, a laser 300 is irradiated on the donor substrate 100 to transfer the transfer layer 140 on the substrate 210. Therefore, a transfer layer 140a is transferred on the exposed pixel electrode 290 to pattern an emission layer.

As can be seen from the foregoing, since the contaminants on the transfer layer 140a is removed by the cleaning process, it is possible to prevent the failures of the display device such as the spots or the pixel defects in the emission region from generating. The patterned transfer layer 140a may be patterned in a stripe shape of a delta shape depending on a shape of the unit pixel. After the patterning process, the substrate 210 is removed from the donor substrate 100, and the substrate 210 removed from the donor substrate is moved to another stage. Then, an opposite electrode is formed on the patterned organic layer to complete the OLED.

In accordance with the present invention, it is possible to prevent the failures of the display device such as the spots or the pixel defects in the emission region from generating due to the contaminants existing on the emission layer and the pixel electrode during the LITI process and therefore more improve the characteristics of the OLED by removing the contaminants existing on the transfer layer of the donor substrate for a laser induced thermal imaging process using the dry cleaning process.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating an organic light emitting display (OLED), comprising:
    preparing a base substrate of a donor substrate;
    forming a light to heat conversion layer and a transfer layer on the base substrate;
    preparing a donor substrate including performing a dry cleaning process after forming the transfer layer, wherein pressure applied on a surface of the transfer layer during the dry cleaning process is not more than 0.7 Mpa;
    preparing a substrate, on which the transfer layer of the donor substrate is to be transferred;
    laminating the donor substrate and the substrate; and
    patterning the transfer layer by irradiating a laser to transfer the transfer layer on the substrate.

2. A method of fabricating a donor substrate, comprising:
    preparing a base substrate;
    forming a light to heat conversion layer and a transfer layer on the base substrate; and
    performing a dry cleaning process after forming the transfer layer, wherein pressure applied on a surface of the transfer layer during the dry cleaning process is not more than 0.7 Mpa.

3. The method according to claim 2, wherein the dry cleaning process is performed by any one of a CO2 method, an ultrasonic method, and a laser pulse method.

4. The method according to claim 2, wherein when the base substrate is flexible, the dry cleaning process is performed after fixing a donor substrate support to a rear surface of the base substrate.

5. The method according to claim 2, wherein the dry cleaning process is performed using a dry cleaning source ejected from a point source.

6. The method according to claim 2, wherein the dry cleaning process is performed using a dry cleaning source ejected from a linear source.

7. The method according to claim 3, wherein the CO2 method removes contaminants by sublimating solid CO2 to collide the sublimated CO2 on the substrate.

8. The method according to claim 3, wherein the CO2 method is performed in a humidity atmosphere of not more than 30%.

9. The method according to claim 3, wherein the ultrasonic method removes particles by generating ultrasonic wave on the surface of the transfer layer of the donor substrate to separate and absorb the particles.

10. The method according to claim 3, wherein the laser pulse method removes particles existing on the surface of the substrate by irradiating a laser pulse on the surface of the transfer layer of the donor substrate.

11. The method according to claim 3, wherein the laser pulse method removes particles existing on the surface of the substrate by vibrating the air around the donor substrate to float the particles.

12. The method according to claim 11, wherein the floated particles are removed by any one of a blowing method and an absorption method.

13. The method according to claim 2, wherein the donor substrate is framed.

14. The method according to claim 2, wherein the donor substrate is a roll type.

15. The method according to claim 2, wherein the transfer layer of the donor substrate is an emission layer of the OLED.

16. The method according to claim 15, wherein the transfer layer of the donor substrate further comprises at least one layer selected from a group of consisting of a hole injection layer, a hole transport layer, a hole blocking layer and an electron injection layer.

17. The method according to claim 2, further comprising a buffer layer interposed between the light to heat conversion layer and the transfer layer.

18. The method according to claim 13, further comprising performing the dry cleaning processes after framing the donor substrate, forming the light to heat conversion layer, and forming the buffer layer, respectively.

19. The method according to claim 17, further comprising performing the dry cleaning processes after framing the donor substrate, forming the light to heat conversion layer, and forming the buffer layer, respectively.

* * * * *